United States Patent [19]
Canning et al.

[11] Patent Number: 5,783,465
[45] Date of Patent: Jul. 21, 1998

[54] COMPLIANT BUMP TECHNOLOGY

[75] Inventors: Everett Joseph Canning, Trenton, N.J.; Donald W. Finley, Fairless Hills, Pa.; Charles K. Hoppes, Whippany, N.J.; Michael Sheridan, Sandown, N.H.

[73] Assignee: Lucent Technologies Inc., Murray Hill, N.J.

[21] Appl. No.: 826,606

[22] Filed: Apr. 3, 1997

[51] Int. Cl.$^6$ .................................................. H01L 21/60
[52] U.S. Cl. ................................................ 438/119; 438/118
[58] Field of Search ................................. 438/108, 118, 438/119

[56] References Cited

U.S. PATENT DOCUMENTS

| 4,941,255 | 7/1990 | Bull ................................ 438/118 |
| 5,326,671 | 7/1994 | Brown et al. .................... 430/311 |
| 5,578,527 | 11/1996 | Chang et al. .................. 438/119 |
| 5,668,059 | 9/1997 | Christie et al. ................ 438/118 |

*Primary Examiner*—Kevin Picardat

[57] ABSTRACT

The specification describes an interconnection technique using compliant metal coated photodefined polymer bumps for mounting and interconnecting component assemblies on substrates such as glass, printed wiring boards, etc. The polymer chosen for the bump structure has a relatively low $T_g$ and the polymer bump is metallized in a way that substantially encapsulates the polymer.

11 Claims, 2 Drawing Sheets

COMPLIANT BUMP TECHNOLOGY

FIELD OF THE INVENTION

This invention relates to interconnection of electrical and optical components on support substrates. More specifically it relates to an improved bump technology for flat panel displays (FPD), multichip modules (MCM), printed wiring board (PWB) interconnections, and the like.

BACKGROUND OF THE INVENTION

Mounting and electrically connecting electrical and optical integrated circuit packages, and optical components such as lasers and LEDs has spawned a variety of interconnection technologies aimed at increasing the interconnect density, increasing reliability, and decreasing assembly costs.

Bump technology has developed along two paths, one for gold bumps used in displays, and one for solder bumps or solder balls used typically in solder assemblies, such as PWBs and MCMs. In current bump technology both gold bumps and solder bumps/balls are formed typically by plating. In some processes evaporation techniques have been used for forming solder bumps, since solder evaporates at a conveniently low temperature. In addition to gold and solder, other metals such as aluminum, nickel, copper, titanium, cobalt, tantalum, the platinum group metals, and alloys thereof are all candidates for current bump technology.

Solder bump/balls are typically 2–6 mils in height. The typical attachment technology is Surface Mount Technology (SMT). The SMT process is usually performed by stencil printing a eutectic solder paste on the PWB bond pads, placing the chip on the PWB with solder bumps/balls aligned to the solder paste coated bonding pads, and completing the attachment by solder reflow.

Gold bump chips are typically of the order of 20 microns high, and are used in TAB packages, and in chip-on-glass (COG) technology. Early COG techniques resembled the conventional lead-frame technique where the chip substrate was bonded face up to the glass support and the bonding pads on the chip were connected to the circuit pattern on the glass using wire bonds. Current COG techniques follow a flip chip approach (FCOG) with the bonding pads on the chip aligned with bonding sites on the glass. These interconnection processes typically use gold bumps on the chip, and adhesives, typically Anisotropic Conductive Films (ACF) to adhere the gold bumps to the bonding sites on the glass. Anisotropic conductive films have proven reliable and cost effective. Details on ACF materials and their use is given by Hisashi Ando et al, Anisotropic Conductive Film, available from Sony Chemical Corporation.

A currently used FCOG process using ACF material involves gold bumps that have very flat bump tops. Typically the bumps are formed by plating the chip surface and lithographically defining the bump sites. The assembly sequence is as follows. The ACF is tacked to the chip bonding site on the glass substrate. The chip is picked up by the automated assembly equipment, aligned to the bond site, and heated to the appropriate bonding temperature. The chip is then placed, pushed through the ACF, and held in place with an appropriate bonding force applied until the adhesive reaches the desired state of cure. During the bonding process the conducting particles within the ACF are trapped between the gold bump and the bond pad, and compressed to deform the particles. Particles typically 7–8 microns in diameter are compressed to 3–5 microns in height. The particles form a monolayer between the chip bumps and the bonding sites so that a large number of conductive paths are formed in the z-direction, while remaining spaced and therefore insulated from one another in the x–y directions.

For these techniques to be effective, the separation between the elements being bonded must be highly uniform in order to develop a consistent level of bonding pressure at each bonding site. To obtain uniform spacing requires precise control over the thickness of the bonding pads, the thickness uniformity of the glass and chip substrate, and the vertical (thickness) dimension of the bumps. Variations on the order of one to two microns are sufficient to cause inadequate compression of the ACF material and result in defects in the bonding operation.

Thickness uniformity can be improved and the reliability of ACF techniques can be increased using photodefinable polymers applied to the chip substrate. These materials are liquid as applied and thus tend to cure with a very planar surface. After the polymer bumps are defined lithographically they are coated with a conductive film. One such approach is referred to by Candice Hellen Brown, Flat Panel Display from Component to Substrate, ISHM '93 Proceedings, pp. 249–253. Such polymer bumps are compliant. This addresses an important problem because the z-axis compliance tends to compensate for the spacing variations just described. Also the x- and y-axis compliance improves the temperature cycling reliability in solder assembly processes. However, with the current state of the art the solder bump/ball interconnection cannot withstand the strains associated with the thermal mismatch between typical chip and PWB materials.

While the suggestion of using a compliant polymer bump should advance the art toward the elimination of the problems just outlined, an effective photodefinable polymer bump technology does not exist in the prior art.

Statement of the Invention

We have developed a compliant polymer bump technology in which the bumps are compressible and are easily deformed when the component chip or assembly is pressed against the support substrate. The required objective is for the bumps to form a gap for the conductive monolayer and the size of the gap is fixed by the properties of the ACF material. The gap is therefore the same for each bump site. Since the bumps are compressible, each bump is able to accommodate that common spacing. The compliant bumps according to our invention are photodefinable polymer bodies coated with a conductive metal layer as more specifically described below. The polymer used in our invention is a known photodefinable dielectric material comprising from twenty to sixty weight percent of triazine and from one to ten weight percent of siloxane-caprolactone copolymer. This material has a glass transition temperature $T_g$ of approximately 180° C. Since a typical bonding process requires temperatures of the order of 220°C.–240° C., it might be expected that this material would not perform adequately as a polymer bump material. However, it has proven highly successful in practice. The reason why a material with such a low $T_g$ survives in this application is not known. We theorize that it is helpful to use a bump structure in which the polymer bump is encapsulated in the conductive metal. Such an arrangement would be expected to aid in preserving the bump geometry during processing at elevated temperatures. While we experienced success with the specific polymer material described, other equivalent materials may be used as well. Equivalent properties would include a realtively low (less than 200° C.) $T_g$.

DETAILED DESCRIPTION

Figure 1:
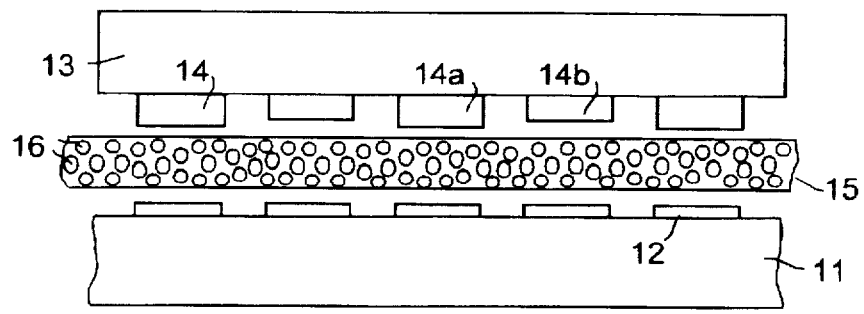
FIGS. 1 and 2 are schematic representations of the bonding operation using standard bump arrays.

Referring to FIG. 1, a portion of a substrate is shown at 11 with an array of contact pads 12 formed e.g. by standard printed circuit techniques. The device chip or assembly 13 carries an array of bumps 14 which may be gold bumps or solder bumps as are standard in the art. Bump 14b is deliberately shown with a smaller profile, i.e. bump height, than bump 14a. The difference is exaggerated for illustrative purposes but represents in a schematic way the reality of variations that occur in normal processing. The ACF film is shown at 15 with conductive particles at 16. In a typical interconnection process, e.g. flip chip on glass (FCOG), the glass substrate is of the order of 1–3 mm thick and the bonding areas 12 are portions of a metallization pattern, e.g. indium tin oxide, or aluminum. The pitch of these pads in current technology is of the order of 50–200 µm and the spacing between pads may be 20–50 µm. The bumps 14 in this illustration are gold bumps with dimensions corresponding to the contact pad array of the substrate in the x-y plane, and with a height (z-dimension) of typically 15–30 µm. The device package is square or rectangular with sides measuring typically in the 2–50 mm range.

Standard ACF materials are typically epoxies, and the conductive particles are typically gold-plated epoxy resin particles. The films are generally 10–40 µm thick and the conductive particles are approximately 5–10 µm in diameter.

Figure 2:
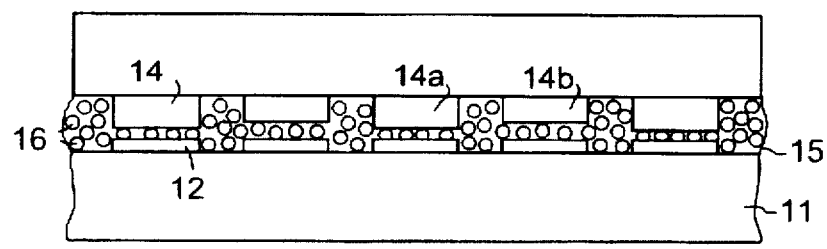

As seen in FIG. 2, after the bonding process has occurred, with the component assembly 13 and the substrate 11 thermocompressively bonded, the desired monolayer of conductive particles 16 are properly trapped under bump 14a, to give a conductive path between the package and the substrate. However, the ACF region under bump 14b is not sufficiently compressed to form a reliable conductive particle monolayer, i.e. there is no conductive particle continuity between the bump and the substrate pad. This region remains the same as the regions between the bumps and pads, and is insulating.

Figure 3:
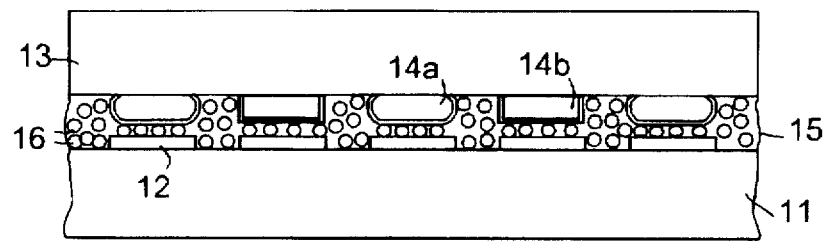
FIG. 3 is a schematic representation similar to that of FIGS. 1 and 2 showing the bonding operation using a compliant polymer bump array.

In FIG. 3 the bumps comprise a metal coated polymer according to the invention. The polymer bumps 14 are coated with metal layer 31. After bonding, it is seen that the bumps are partially compressed. This compression allows all of the bumps to compress the conductive particles in the ACF material sufficiently to form the conductive particle bridge between the substrate and component package. The conductive particles, typically of the order of 7 microns in their original shape (FIG. 1) are compressed to about 3 microns. Meanwhile the bumps themselves compress typically by 2–3 microns. In FIG. 3 it is evident that the bump with the lowest height in the z-direction, bump designated 14b, adequately compresses the ACF material to form a conductive particle path between pad 12 and the component assembly 13. The higher bump 14a undergoes somewhat more compression and deformation, as shown, to form the conductive bond at its site. The compliancy of the bumps allows all bumps in the array to self adjust to fill the space required but still impart sufficient compression to trap conductive particles beneath each bump. To achieve this it is recommended that the polymer material used to form the bumps be less compliant than the epoxy material of the conductive particles. One method to achieve the desired compliance relationship is to have the $T_g$ of the epoxy relatively sharp, i.e. sharper than the $T_g$ of the polymer, and lower in temperature than the $T_g$ of the polymer.

It will be evident to those skilled in the art that the mechanical properties of the bump are critical to a successful bonding operation. The first requirement is that the bump material must withstand the temperatures of the bonding operation, i.e. 220°–240° C. At the bonding temperature the material should provide the desired resiliency while still retaining the original bump shape, size and position. It must be compliant, but retain sufficient firmness to support the hydrodynamic pressure required to compress the ACF material and retain the conductive particle monolayer as described above. These considerations point to a material with a glass transition temperature $T_g$ of 220° C., the minimum bonding temperature, or above.

We have discovered that contrary to expectations, a polymer material with a $T_g$ substantially, i.e. at least 20° C., below the bonding temperature performs exceptionally well in this process. We have not been able to establish the reason for this performance. However we postulate that the success is characteristic of materials with relatively low $T_g$ values, and especially where the $T_g$ of the epoxy particles is below the $T_g$ of the polymer bump material. It may also be attributable in part to the structure of the bump. In any case we have demonstrated successful bonding processes where other bump materials and bonding approaches have not been successful.

Figure 4:
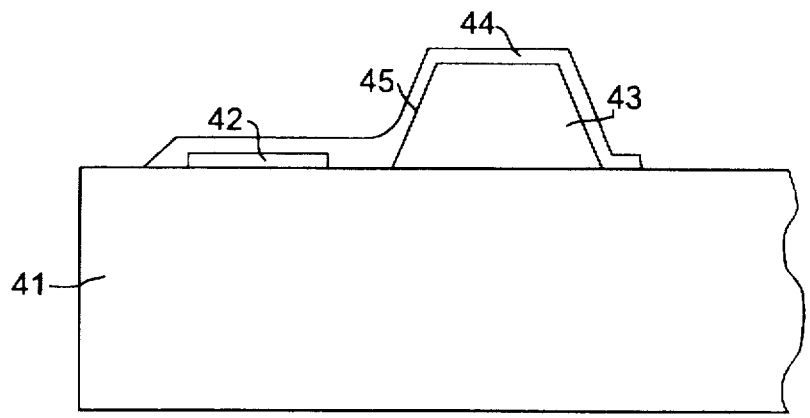
FIG. 4 is a front section of a bump structure according to the invention.

The structure of the bump is shown in FIG. 4. The substrate of the component assembly is shown at 41. The substrate 41 is typically a semiconductor chip. One or more chips, and multiple bonding sites, comprise the total package but only one bonding site and bump interconnect is shown for simplicity. The chip 41 carries a conventional metallization pattern of which just bonding pad 42 is shown. The polymer bump 43 is shown adjacent the bonding pad 42 with metallization layer 43 formed so as to contact the bonding pad 42 and to cover the exposed surface of the polymer bump 43. While the metallization layer is shown covering the bonding pad 42 in FIG. 4, it is sufficient that it contact a portion of the pad. However, with the polymer bump we prefer that the metal covers the entire exposed surface of the bump. The mechanical properties of the metallization layer, primarily the thickness and shape, contribute to the overall mechanical properties of the bump. The shape of the metal layer is essentially determined by the portion of the bump that is covered. We theorize that the combination of a low $T_g$ material and the metallization encapsulant, i.e. the metal covering the entire free surfaces, of the polymer bump are responsible for the success of our process. However, the most unique feature is the use of a photodefinable low $T_g$ material, an example of which we describe below. The photodefinable feature simplifies the bonding process and reduces the cost. The polymer bump represented by 43 in FIG. 4 was formed by coating the surface of the component package 41 with a polymer layer, by spray coating, or other appropriate technique, then masking the polymer layer with a photomask, exposing the mask to UV radiation, and removing the unexposed regions of the polymer layer by means of a developing process or using a developing solution.

The photodefinable polymer successfully used in our process is described and claimed in U.S. Pat. No. 5,326,671, which is incorporated herein by reference. The polymer is a photodefinable triazine-based mixture including a photosensitive acrylate moiety. It comprises from twenty to sixty percent by weight of triazine and from one to ten percent by weight of siloxane-caprolactone copolymer. It may also include up to twenty percent by weight of novolak epoxy acrylate to improve the photodefinable properties. Additionally the mixture may optionally comprise one or more of the following: two to eight percent by weight of bis-phenol-A diglycidyl ether monoepoxyacrylate, zero to twenty percent by weight of carboxyl-terminated butadiene nitrile rubber, two to six percent of N-vinylpyyrolidone, one to ten percent of trimethylolpropanetriacrylate, zero to five percent glycidoxypropyltrimethoxysilane, 0.05 to five weight percent photoinitiator, zero to two percent pigment, 0.1 to one percent surfactant, zero to 0.3 percent copper benzoylacetonate, and thirty to fifty percent solvent.

In our process the triazine composition just defined is spray coated on substrate 41 to the desired thickness then baked at 50 degrees C for two hours. Using the technique of the invention we have successfully produced bumps from a few microns to 8 mils in thickness. The portion 43 of the layer (remaining layer not shown in FIG. 4) is exposed to actinic radiation i.e. UV radiation at 365 nm with a power of twenty to forty milliwatts per square centimeter. Exposure to the actinic light crosslinks and cures the polymer making it insoluble in the developer solution. The layer is developed by spraying on a suitable developer, e.g. butyl butyrate, thereby removing the unexposed regions and leaving the array of polymer bumps represented by 43. The material of these particle bumps has an average $T_g$ of less than 200 degrees C., typically approximately 180 degrees C.

It is characteristic of this photodefined material to have sloped sidewalls, as shown at 45 in FIG. 4. This is due to the material properties and the isotropic nature of the dissolution process during development. The ratio of solubility between the exposed and unexposed regions of the polymer layer is finite, so that some of the exposed surface regions of the layer dissolve slightly while the solvent descends through the thickness of the unexposed regions. The sidewall taper is slight but is helpful in promoting sidewall coverage when the bump is metallized.

The metallization layer 44 is then applied by sputtering, evaporation, or other appropriate technique. We successfully used sputtering to produce the structure of FIG. 4. The thickness of layer 44 is preferably in the range 1–8 microns. The material of layer 44 may be selected from a variety of metals as stated previously. We sputtered a layer of titanium, 1000–3000 Angstroms in thickness, followed by an alloy layer of Ti-Pd 10–200 Angstroms thick, followed by approximately 1–6 microns of copper. Optionally we followed the foregoing three layers with a final coating of 2000–6000 Angstroms of Ni, and 1000–3000 Angstroms of gold.

While we have illustrated and described a compliant polymer bump interconnect technology in which the polymer bumps are essentially completely encapsulated by metal, variations of this structure may permit partial encapsulation while still substantially achieving the advantages we describe. Accordingly we define our invention in its broadest terms as requiring a metallization layer that encapsulates a substantial portion of the polymer bump. More specifically we define a structure in which the top surface of the polymer bump is covered with a metal layer, with portions of the metal layer extending down at least two sides of the bump. A structure can be envisioned in which the polymer bump is rectangular, and metal encapsulating the long sides of the rectangular structure would substantially meet the objective of mechanically containing the polymer bump during bonding.

The bonding operation is conventional and involves the application of heat to the surfaces being bonded, while pressing the surfaces together. As suggested earlier the ACF bonding temperatures are typically above 200 degrees C. The pressure depends upon the ACF material and usually is above 0.5 tons per square inch of bump area, typically about 5 tons per square inch of bump area.

The metal coated polymer material is known to withstand typical SMT solder reflow processes so that solder attachment for the polymer bump technology and those skilled in the art will recognize the utility of the improved bump technology of this invention to typical prior art solder bump techniques.

The interconnect technique of the invention can be used to advantage in a wide variety of applications. Most of these will involve electronic or photonic integrated circuits and electrooptic devices. For the purpose of definition the term electronic package is intended to cover generically all such integrated circuit devices, electrooptic devices, and related electrical products.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Method for bonding two elements together, said two elements consisting of an electrical or photonic component and a substrate for supporting said component, the method comprising the steps of:

a. forming a plurality of bonding pad on the first of said elements, b. depositing a layer of photodefinable polymer on the surface of said second element, said photodefinable polymer having a glass transition temperature $T_g$, c. masking said layer of photodefinable polymer with a mask having a plurality of actinic light transparent features corresponding to a plurality of bumps, d. exposing said masked photodefinable layer to actinic light, e. developing said photodefinable layer to produce a plurality of bump features on the surface of said second element, each of said plurality of bump features having a to p surface and sidewall surfaces exposed by the developing step e., f. coating the top surface and the sidewall surfaces of each of said bumps with a metal coating so that the polymer bump is substantially completely encased in said metal coating, g. positioning the said plurality of bumps in registration with said plurality of bonding pads, h. providing a layer of anisotropic conductive film between the plurality of bonding pads and the plurality of bumps, i. urging said first and second elements together, j. heating said first and second elements to a bonding temperature, while applying pressure to said elements to bond said plurality of bumps to said plurality of bonding pads.

2. The method of claim 1 in which the glass transition temperature of said polymer is less than the said bonding temperature.

3. The method of claim 2 in which the anisotropic conductive film consists of a polymer material with a glass transition temperature less than the glass transition temperature of said polymer comprising said bumps.

4. The method of claim 2 in which the said bonding temperature is in the range 220°–240° C. and the said glass transition temperature of the polymer of said bumps is less than 200° C.

5. The method of claim 2 in which the said metal coating comprises copper.

6. The method of claim 2 in which the thickness of said photodefinable layer is in the range of 2–400 microns.

7. The method of claim 2 in which the sidewalls of the bumps are sloped.

8. The method of claim 2 in which the said polymer is formed from a mixture comprising twenty to sixty weight percent of triazine and from one to ten weight percent of siloxane-caprolactone copolymer.

9. The method of claim 8 in which the said mixture further includes up to ten weight percent of novolak epoxy acrylate.

10. The method of claim 9 in which the said mixture includes one or more of the following:

two to eight percent by weight of bis-phenol-A diglycidyl ether monoepoxyacrylate, zero to twenty percent by weight of carboxyl-terminated butadiene nitrile rubber, two to six percent of N-vinylpyyrolidone, one to ten percent of trimethylolpropanetriacrylate, zero to five percent glycidoxypropyltrimethoxysilane, 0.05 to five weight percent photoinitiator, zero to two percent pigment, 0.1 to one percent surfactant, zero to 0.3 percent copper benzoylacetonate, and thirty to fifty percent solvent.

11. The method of claim 2 in which the metal coating is selected from the group consisting of Al, Ni, Cu, Ti, Co, Ta, Pt, Pd, and alloys thereof.

* * * * *